United States Patent
Takanashi et al.

(10) Patent No.: US 9,040,161 B2
(45) Date of Patent: May 26, 2015

(54) PROTECTIVE SHEET FOR SOLAR CELL MODULE, AND SOLAR CELL MODULE

(75) Inventors: Yasunari Takanashi, Tokyo (JP); Kiichiro Kato, Tokyo (JP)

(73) Assignee: Lintec Corporation, Tokyo (JP)

( * ) Notice: Subject to any disclaimer, the term of this patent is extended or adjusted under 35 U.S.C. 154(b) by 113 days.

(21) Appl. No.: 13/637,052

(22) PCT Filed: Mar. 24, 2011

(86) PCT No.: PCT/JP2011/057234
§ 371 (c)(1),
(2), (4) Date: Nov. 19, 2012

(87) PCT Pub. No.: WO2011/118727
PCT Pub. Date: Sep. 29, 2011

(65) Prior Publication Data
US 2013/0192673 A1    Aug. 1, 2013

(30) Foreign Application Priority Data

Mar. 26, 2010   (JP) .................................. 2010-072670

(51) Int. Cl.
| | |
|---|---|
| B32B 27/08 | (2006.01) |
| H01L 31/048 | (2014.01) |
| B32B 27/32 | (2006.01) |
| B32B 27/30 | (2006.01) |
| B32B 27/36 | (2006.01) |
| H01L 31/049 | (2014.01) |

(52) U.S. Cl.
CPC ............ *H01L 31/0487* (2013.01); *B32B 27/08* (2013.01); *B32B 27/32* (2013.01); *B32B 27/306* (2013.01); *B32B 27/308* (2013.01); *B32B 27/325* (2013.01); *B32B 27/36* (2013.01); *H01L 31/048* (2013.01); *B32B 2457/12* (2013.01); *Y02E 10/50* (2013.01); *H01L 31/049* (2014.12)

(58) Field of Classification Search
CPC .......................... B32B 2457/12; H01L 31/048
USPC ................... 136/256; 428/515, 421, 520, 516
See application file for complete search history.

(56) References Cited

U.S. PATENT DOCUMENTS

2010/0313946 A1*  12/2010  Higuchi et al. ............... 136/256

FOREIGN PATENT DOCUMENTS

| | | |
|---|---|---|
| CN | 100495735 C | 6/2009 |
| JP | 08-306947 A | 11/1996 |
| JP | 2000-106450 A | 4/2000 |
| JP | 2001-036126 A | 2/2001 |
| JP | 2001044481 A | 2/2001 |
| JP | 2001-196617 A | 7/2001 |
| JP | 2002100788 A | 4/2002 |
| JP | 2006-165434 A | 6/2006 |

(Continued)

OTHER PUBLICATIONS

Machine translation for JP 2006-253427.*

(Continued)

*Primary Examiner* — Ling Choi
*Assistant Examiner* — Catherine S Branch
(74) *Attorney, Agent, or Firm* — Christopher Casieri

(57) ABSTRACT

A protective sheet for a solar cell module that includes a cycloolefin resin layer laminated to one surface of a substrate film with a polyolefin resin layer disposed therebetween, wherein the polyolefin resin layer and the cycloolefin resin layer are formed by co-extrusion molding.

3 Claims, 3 Drawing Sheets

(56) References Cited

FOREIGN PATENT DOCUMENTS

| JP | 2006-198922 A | 8/2006 |
| JP | 2006-253427 A | 9/2006 |
| JP | 2006-294780 A | 10/2006 |
| JP | 2008-211158 A | 9/2008 |
| WO | WO 2008050626 A1 * | 5/2008 |

OTHER PUBLICATIONS

Machine translation of Tan et al. (JP 2006-253427).*
Office Action for Japanese Application No. JP-2012-507071 mailed on Dec. 17, 2013.
Author Unknown, English Abstract of Japanese patent publication No. 2006-165434 [online], [retrieved on Jul. 31, 2013]. Retrieved from the Internet,URL:http://www19.ipdl.inpit.go.jp/PA1/result/detail/main/wX-acMaDA418165434P1.htm>.
Girard, Sarah; European Search Report from corresponding European patent application No. EP11759532, Jun. 28, 2013, pp. 1-6, European Patent Office, Netherlands.
Girard, Sarah, European Search Report from corresponding European patent application No. EP11759532, Jun. 28, 2013, pp. 1-6, European Patent Office, Netherlands.
International Search Report.
Office Action for Chinese Application No. 201180015441.3 mailed on Mar. 13, 2015.

* cited by examiner

PROTECTIVE SHEET FOR SOLAR CELL MODULE, AND SOLAR CELL MODULE

TECHNICAL FIELD

The present invention relates to a protective sheet for a solar cell module which can be used as a front surface protective sheet or a back surface protective sheet for the solar cell module, and also relates to a solar cell module provided with the protective sheet for a solar cell module.

Priority is claimed on Japanese Patent Application No. 2010-072670, filed Mar. 26, 2010, the content of which is incorporated herein by reference.

BACKGROUND ART

Solar cell modules, which are devices for converting the energy from sunlight into electrical energy, are attracting much attention as clean energy sources that are capable of generating electricity without discharging carbon dioxide, thereby responding to environmental problems such as atmospheric pollution and global warming.

Generally, a solar cell module includes basically solar cell that perform the photoelectric conversion, a encapsulant (filler layer) formed from an electrical insulator that encapsulates the solar cell, a front surface protective sheet (front sheet) that is laminated to the front surface of the encapsulant, and a back surface protective sheet (back sheet) that is laminated to the back surface of the encapsulant. The solar cell module requires sufficient moisture resistance and weather resistance to withstand use for long periods in outdoor and indoor environments.

The main structure of a solar cell module is composed of the solar cell that function as the photovoltaic elements, the encapsulant which is an electrical insulator that prevents shorts within the electrical circuits, and the protective sheets that protect the solar cell and the encapsulant. The front surface protective sheet and the back surface protective sheet are bonded to the light incident surface (front surface) and the back surface respectively of the solar cell module, and prevent water vapor from entering the solar cell module. These protective sheets for the solar cell module require excellent water vapor barrier properties, and must also exhibit excellent adhesion to the encapsulant of the solar cell module. One example of the encapsulant used in the solar cell module is an ethylene-vinyl acetate copolymer (hereafter also referred to as EVA).

A back surface protective sheet for a solar cell module has been disclosed in which a vapor deposited film of an inorganic oxide is provided on one surface of a substrate film, and an extruded resin layer formed from a resin composition containing a polyolefin-based resin and a cyclic polyolefin-based resin is then provided on the surface of the vapor deposited film of the inorganic oxide (for example, see Patent Document 1). This back surface protective sheet is fused to a encapsulant composed of an ethylene-vinyl acetate copolymer (EVA) by hot pressing.

PRIOR ART DOCUMENTS

Patent Document

[Patent Document 1]
Japanese Unexamined Patent Application, First Publication No. 2001-196617

DISCLOSURE OF INVENTION

Problems to be Solved by the Invention

However, the back surface protective sheet disclosed in Patent Document 1 suffers from poor adhesion between the extruded resin layer and the substrate film, and poor adhesion between the extruded resin layer and the encapsulant, and the protective sheet tends to peel after extended use.

The present invention takes the above circumstances into consideration, with an object of providing a protective sheet for a solar cell module which, when applied to a solar cell module, exhibits excellent adhesion to the encapsulant of the solar cell module, and also exhibits superior water vapor barrier properties, as well as providing a solar cell module provided with this protective sheet for a solar cell module.

Means to Solve the Problems

A first aspect of the present invention is a protective sheet for a solar cell module that includes a cycloolefin resin layer laminated to one surface of a substrate film with a polyolefin resin layer disposed therebetween, wherein the polyolefin resin layer and the cycloolefin resin layer are formed by co-extrusion molding.

A second aspect of the present invention relates to the protective sheet for a solar cell module according to the first aspect, wherein the polyolefin resin layer is composed of one resin selected from the group consisting of polyethylene, maleic acid-modified polyethylene, ethylene-(meth)acrylate copolymers, ethylene-(meth)acrylate-glycidyl methacrylate copolymers, and ethylene-vinyl acetate copolymers.

A third aspect of the present invention relates to the protective sheet for a solar cell module according to the first or second aspect, wherein a fluororesin layer is laminated to the surface of the substrate film opposite the surface to which the polyolefin resin layer and the cycloolefin resin layer are laminated.

Moreover, a fourth aspect of the present invention is a solar cell module produced using the protective sheet for a solar cell module according to any one of the first to third aspects.

Effects of the Invention

The protective sheet for a solar cell module according to the present invention has a structure in which a polyolefin resin layer and a cycloolefin resin layer are laminated by co-extrusion molding to one surface of a substrate film. As a result, in the protective sheet for a solar cell module according to the present invention, the cycloolefin resin, which exhibits excellent water vapor barrier properties and excellent adhesion to the encapsulant, is laminated to the substrate film with good adhesion via the polyolefin resin layer, and therefore the adhesion to the encapsulant of the solar cell module is excellent, and the water vapor barrier properties are also excellent.

Further, by applying the protective sheet for a solar cell module according to the present invention to a solar cell module, a solar cell module having superior durability and moisture resistance can be provided.

EMBODIMENTS OF THE INVENTION

Embodiments of the protective sheet for a solar cell module and the solar cell module according to the present invention are described below.

These embodiments are described in detail to facilitate comprehension of the gist of the present invention, but unless specified otherwise, in no way limit the scope of the present invention.

(1) First Embodiment

Figure 1:
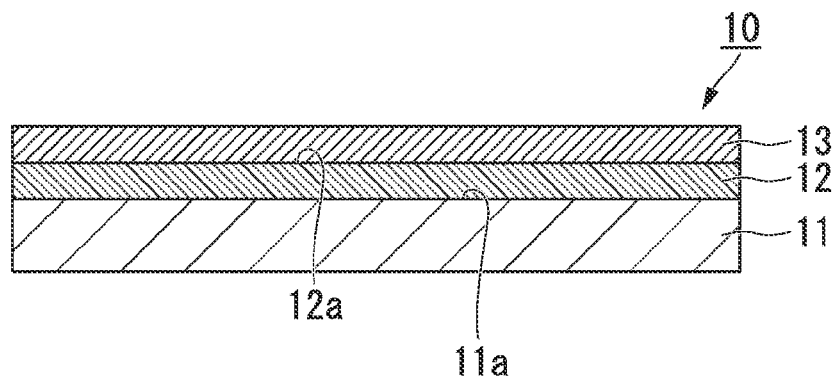
FIG. 1 is a cross-sectional view illustrating one embodiment of the protective sheet for a solar cell module according to the present invention.

FIG. 1 is a cross-sectional view illustrating a first embodiment of the protective sheet for a solar cell module according to the present invention.

The solar cell module protective sheet 10 of this embodiment includes a substrate film 11, and a cycloolefin resin layer 13 laminated on one surface 11a of the substrate film 11 with a polyolefin resin layer 12 disposed therebetween.

This solar cell module protective sheet 10 can be used as the front sheet or the back sheet of a solar cell module.

Any resin film can be used as the substrate film 11, provided it has electrical insulating properties and can be laminated to the polyolefin resin layer 12.

The resin film used for the substrate film 11 may be selected from among those resin films typically used as the resin film within a protective sheet for a solar cell module. Examples of such resin films include films or sheets formed from resins including olefin-based resins such as polyethylene and polypropylene, ester-based resins such as polyethylene terephthalate (PET), polyethylene naphthalate and polybutylene terephthalate, amide-based resins such as Nylon (a brand name), carbonate-based resins, styrene-based resins, acrylonitrile-based resins, vinyl chloride-based resins, vinyl acetal-based resins, vinyl butyral-based resins, and fluororesins. Among these resin films, films formed from polyesters are preferred, and PET films are particularly desirable.

In order to prevent hydrolysis, a PET film having a reduced oligomer content such as Lumirror X10S (a product name, manufactured by Toray Industries, Inc.) is preferred.

Furthermore, in order to prevent shrinkage of the PET film when co-extrusion molding is used to laminate the polyolefin resin and the cycloolefin resin onto the PET film, a PET film having a reduced heat shrinkage rate such as Tetoron SL (a product name, manufactured by Teijin DuPont Films Ltd.) is also desirable.

The thickness of the substrate film 11 may be set appropriately on the basis of the electrical insulation properties required by the solar cell module. For example, in those cases where the substrate film 11 is a resin film, a thickness within a range from 10 to 300 μm is preferred. More specifically, if the substrate film 11 is a PET film, then from the viewpoints of lightening the weight while ensuring good electrical insulation properties, the thickness of the PET sheet is preferably within a range from 10 to 300 μm, more preferably from 20 to 250 μm, and still more preferably from 30 to 200 μm.

The polyolefin resin layer 12 is provided for the purpose of bonding the cycloolefin resin layer 13 to the substrate film 11. As described below, the polyolefin resin layer 12 and the cycloolefin resin layer 13 are laminated to the substrate film 11 by co-extrusion molding, and therefore at the interface 12a between the polyolefin resin layer 12 and the cycloolefin resin layer 13, the resins of the two layers are laminated together in a melted state. As a result, the adhesion between the polyolefin resin layer 12 and the cycloolefin resin layer 13 is excellent. Further, the polyolefin resin layer 12 exhibits good adhesion to the substrate film 11. Consequently, by providing the polyolefin resin layer 12, the substrate film 11 and the cycloolefin resin layer 13 can be bonded together strongly.

Examples of the polyolefin resin that constitutes the polyolefin resin layer 12 include polyethylenes such as low-density polyethylene (LDPE, density: not less than 0.910 g/cm$^3$ but less than 0.930 g/cm$^3$), medium-density polyethylene (MDPE, density: not less than 0.930 g/cm$^3$ but less than 0.942 g/cm$^3$) and high-density polyethylene (HDPE, density: not less than 0.942 g/cm$^3$), maleic anhydride-grafted polyethylene, polypropylene (PP), olefin-based elastomers (TPO), ethylene-vinyl acetate copolymers (EVA), ethylene-vinyl acetate-maleic anhydride copolymers, ethylene-(meth)acrylate copolymers, and ethylene-(meth)acrylate-maleic anhydride copolymers. Among these, from the viewpoint of the adhesion to the substrate film, a low-density polyethylene, maleic anhydride-grafted polyethylene, ethylene-(meth)acrylate copolymer, ethylene-(meth)acrylate-glycidyl methacrylate copolymer or EVA is preferred. Further, in the present invention, the polyolefin resin that constitutes the polyolefin resin layer 12 does not include a cycloolefin resin.

There are no particular limitations on the thickness of the polyolefin resin layer 12, provided the effects of the present invention are not impaired, and the thickness may be adjusted appropriately in accordance with the variety of the polyolefin resin layer 12. The thickness of the polyolefin resin layer 12 is, for example, preferably within a range from 1 μm to 200 μm, and from the viewpoints of lightening the weight while ensuring good electrical insulation properties, is more preferably within a range from 10 μm to 200 and still more preferably from 20 μm to 150 μm.

The cycloolefin resin that constitutes the cycloolefin resin layer 13 is preferably a ring-opening polymer of a cycloolefin resin having an alicyclic structure within the main chain and/or a side chain, or a hydrogenated product thereof, and from the viewpoints of the weather resistance and moisture resistance and the like, is preferably a ring-opening polymer of a cycloolefin resin having an alicyclic structure within the main chain or a hydrogenated product thereof.

Examples of the alicyclic structure within the polymer include saturated cyclic hydrocarbon (cycloalkane) structures and unsaturated cyclic hydrocarbon (cycloalkene) structures, but from the viewpoints of mechanical strength and heat resistance and the like, the polymer preferably includes a cycloalkane structure. Although there are no particular limitations on the number of carbon atoms within the alicyclic structure, usually, if the alicyclic structure contains 4 to 30 carbon atoms, preferably 5 to 20 carbon atoms, and more preferably 5 to 15 carbon atoms, then a good balance can be achieved between properties such as the mechanical strength, the heat resistance and the moldability.

The molecular weight of the cycloolefin resin may be selected appropriately in accordance with the intended usage, but the polyisoprene-equivalent weight-average molecular weight of a cyclohexane solution of the polymer resin (or a toluene solution in those cases where the polymer resin is insoluble in cyclohexane), measured using the gel permeation chromatography method, is typically not less than 5,000, and is preferably within a range from 5,000 to 500,000, more preferably from 8,000 to 200,000, and still more preferably from 10,000 to 100,000, as such a molecular weight yields a better balance between the mechanical strength of the sheet and the moldability of the resin.

The cycloolefin resin is preferably a cycloolefin resin that contains essentially no unsaturated bonds, and may be hydrogenated if required. In those cases where hydrogenation is necessary, the hydrogenation rate is represented by the ratio of the number of mols of hydrogenated carbon-carbon bonds relative to the total number of mols of carbon-carbon double bonds. A value for this hydrogenation rate of at least 95%, preferably at least 98%, and more preferably 99% or greater, is preferred in terms of the weather resistance and the water vapor barrier properties.

The melt mass-flow rate (MFR) for the cycloolefin resin, measured in accordance with ISO 1133:1997 under conditions including a test temperature of 280° C. and a loading of 21.18 N, may be selected appropriately in accordance with the intended usage, but is typically within a range from 1 to 100 g/10 min., and preferably from 10 to 70 g/10 min. If the MFR is too low, then the temperature to which the molding material must be heated during molding increases, meaning processing of the material may be difficult, whereas if the MFR is too high, then molding faults such as burrs may occur during molding.

There are no particular limitations on the thickness of the cycloolefin resin layer 13, provided the effects of the present invention are not impaired, and the thickness may be adjusted appropriately in accordance with the variety of the cycloolefin resin layer 13. The thickness of the cycloolefin resin layer 13 is, for example, preferably within a range from 1 μm to 200 μm, and from the viewpoints of lightening the weight while ensuring good electrical insulation properties, the thickness is more preferably within a range from 10 μm to 200 μm, and still more preferably from 50 μm to 150 μm.

Next is a description of a method of producing the solar cell module protective sheet 10.

In order to laminate the cycloolefin resin layer 13 to one surface of the substrate film 11 with the polyolefin resin layer 12 disposed therebetween, the polyolefin resin layer 12 and the cycloolefin resin layer 13 are preferably laminated to the substrate film 11 using a co-extrusion molding method.

This co-extrusion molding method offers the advantage that, because the polyolefin resin layer 12 and the cycloolefin resin layer 13 are laminated together in a melted state, a high adhesive strength can be obtained. Further, this type of co-extrusion molding method also offers the advantage that, because the polyolefin resin layer 12 and the cycloolefin resin layer 13 are not stretched, the solar cell module protective sheet 10 does not undergo shrinkage.

The co-extrusion molding method can be classified as one of two types. Namely, the feed block method in which the resins supplied from a plurality of extruders (in the following description of the case where two extruders are used, these extruders are also referred to as "extruder (A)" and "extruder (B)") are laminated together and then subjected to widening, and the multi-manifold method in which the individual resins are first widened, before undergoing lamination. Either of these methods may be used, but from the viewpoint of the accuracy of the resulting thickness, the multi-manifold method is preferred.

In order to form the polyolefin resin layer 12 and the cycloolefin resin layer 13 on the substrate film 11 by co-extrusion molding, first, the polyolefin resin for forming the polyolefin resin layer 12 is melted and kneaded, and is then supplied to an extruder (A) that has been heated to a temperature of 80 to 350° C., and introduced into a co-extruder.

The temperature used for melting the polyolefin resin is set to a temperature that ensures that the temperature (heat) of the melted polyolefin resin does not cause shrinkage of the substrate film 11, and is preferably a temperature within a range from 80 to 350° C., and more preferably from 150 to 300° C.

On the other hand, in order to form the cycloolefin resin layer 13, the cycloolefin resin for forming the cycloolefin resin layer 13 is melted and kneaded, and is then supplied to an extruder (B) that has been heated to a temperature of 80 to 350° C., and introduced into a co-extruder.

The temperature used for melting the cycloolefin resin is preferably set to a similar temperature to that used for the polyolefin resin, and is preferably a temperature within a range from 80 to 350° C., and more preferably from 150 to 300° C.

In this manner, the polyolefin resin and the cycloolefin resin are supplied to the extruder (A) and the extruder (B) respectively, and the melted polyolefin resin and cycloolefin resin are extruded and laminated onto the surface 11a of the substrate film 11 while the substrate film 11 is moved at a constant speed. In the co-extruder, the resins are co-extruded in a sheet like form, and form a two-layer structure in which the polyolefin resin inside the extruder (A) is laminated facing the substrate film 11, while the cycloolefin resin inside the extruder (B) forms the outermost layer (on the front surface 12a of the polyolefin resin layer 12), thus completing production of the solar cell module protective sheet 10.

The amount of the polyolefin resin discharged from the extruder (A) and the amount of the cycloolefin resin discharged from the extruder (B) may be adjusted appropriately in accordance with the desired thicknesses for the polyolefin resin layer 12 and the cycloolefin resin layer 13, and the speed (movement speed) at which the substrate film 11 is moved.

The substrate film 11 is moved (transported) at a constant speed in a longitudinal direction, and the speed of that movement is adjusted appropriately in accordance with the amounts of the polyolefin resin and the cycloolefin resin discharged onto the substrate film 11.

With this type of co-extrusion molding, by simply simultaneously extruding the melted polyolefin resin and cycloolefin resin out of the co-extruder and laminating the resins onto the surface 11a of the substrate film 11, the polyolefin resin layer 12 and the cycloolefin resin layer 13 can be bonded to the substrate film 11. In the polyolefin layer 12 and the cycloolefin resin layer 13 laminated by this type of co-extrusion molding, the melted resins undergo mutual dissolution at the interface 12a during the co-extrusion molding, and therefore the formed polyolefin resin layer 12 and cycloolefin resin layer 13 exhibit strong adhesion properties. Further, the polyolefin resin layer that is extruded on top of the substrate film 11 exhibits favorable adhesion to the substrate film 11, meaning the cycloolefin resin layer 13 is able to be bonded strongly to the substrate film 11 via the polyolefin resin layer 12.

In this manner, in the solar cell module protective sheet 10, the cycloolefin resin layer 13, which exhibits excellent water vapor barrier properties and excellent adhesion to encapsulants, is bonded strongly to the substrate film 11 via the polyolefin resin layer 12 by co-extrusion molding, and therefore when the solar cell module protective sheet 10 is used as the front sheet or back sheet of a solar cell module, the adhesion to the solar cell module is good, and penetration of water vapor into the solar cell module can be prevented over long periods.

This embodiment illustrated an example of a solar cell module protective sheet 10 having a three-layer structure in which the cycloolefin resin layer 13 was laminated onto one surface 11a of the substrate film 11 with the polyolefin resin layer 12 disposed therebetween, but the protective sheet for a solar cell module according to the present invention is not limited to this particular configuration. There are no particular limitations on the number of layers formed on the surface 11a of the substrate film 11 by co-extrusion molding, and for example, the polyolefin resin layer and the cycloolefin resin layer may be laminated to the substrate film 11 via two-layer co-extrusion, or the laminated structure of the polyolefin resin layer and the cycloolefin resin layer may be repeated to form a four-layer structure.

(2) Second Embodiment

Figure 2:
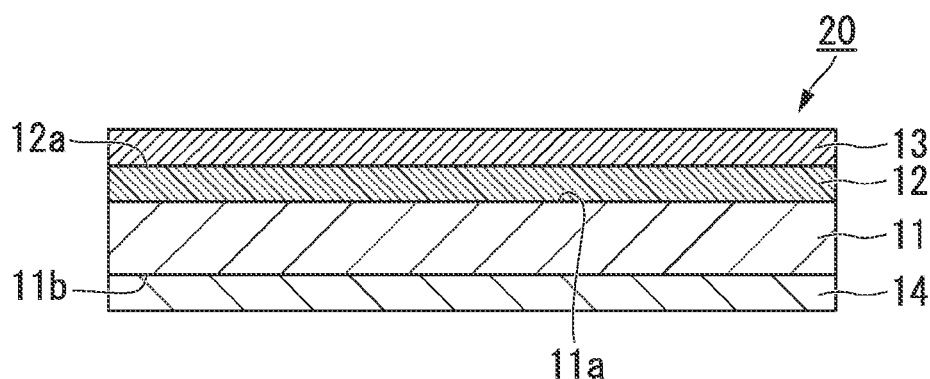
FIG. 2 is a cross-sectional view illustrating another embodiment of the protective sheet for a solar cell module according to the present invention.

FIG. 2 is a cross-sectional view illustrating a second embodiment of the protective sheet for a solar cell module according to the present invention.

In FIG. 2, structural elements that are the same as those of the solar cell module protective sheet 10 illustrated in FIG. 1 are labeled using the same symbols, and description of those elements is omitted.

In a similar manner to the first embodiment, the solar cell module protective sheet 20 of this embodiment may be used as either the front sheet or the back sheet of a solar cell module.

In the solar cell module protective sheet 20, in addition to the structure of the solar cell module protective sheet 10 of the first embodiment, a fluororesin layer 14 is provided on the surface 11b of the substrate film 11 opposite the surface 11a to which the polyolefin resin layer 12 and the cycloolefin resin layer 13 are laminated.

In this embodiment, the substrate film 11, the polyolefin resin layer 12 and the cycloolefin resin layer 13 have the same structures as those described for the first embodiment.

The thickness of the fluororesin layer 14 is set with due consideration of the weather resistance, the chemical resistance, and minimizing the weight, and is preferably within a range from 5 μm to 50 μm, and more preferably from 10 μm to 30 μm.

There are no particular limitations on the fluororesin layer 14, provided it is a layer that contains fluorine. Examples of this layer that contains fluorine include sheets having a fluorine-containing resin, and coating films obtained by applying a coating material having a fluorine-containing resin. Among these options, in order to minimize the weight of the solar cell module protective sheet 20, a thinner fluororesin layer 14 is preferred, and therefore a coating film obtained by applying a coating material having a fluorine-containing resin is particularly desirable.

In those cases where the fluororesin layer 14 is a sheet having a fluorine-containing resin, the fluororesin layer 14 is laminated to the substrate film 11 via an adhesive layer. This adhesive layer is formed from an adhesive that exhibits good adhesion to the substrate film 11.

Examples of adhesives that can be used for forming the adhesive layer include polyacrylic-based adhesives, polyurethane-based adhesives, epoxy-based adhesives, polyester-based adhesives, and polyester polyurethane-based adhesives. These adhesives may be used individually, or two or more adhesives may be used in combination.

On the other hand, in those cases where the fluororesin layer 14 is a coating film obtained by applying a coating material having a fluorine-containing resin, the fluororesin layer 14 is usually laminated to the substrate film 11 by applying the coating material that includes the fluorine-containing resin directly to the substrate film 11, without using an adhesive layer.

Examples of the aforementioned sheet having a fluorine-containing resin include sheets prepared by processing a resin that contains, as the main component, polyvinyl fluoride (PVF), ethylene chlorotrifluoroethylene (ECTFE) or ethylene tetrafluoroethylene (ETFE).

Tedlar (a product name, manufactured by E.I. du Pont de Nemours and Company) can be used as the resin containing PVF as the main component.

Halar (a product name, manufactured by Solvay Solexis Company) can be used as the resin containing ECTFE as the main component.

Fluon (a product name, manufactured by Asahi Glass Co., Ltd.) can be used as the resin containing ETFE as the main component.

There are no particular limitations on the aforementioned coating material that includes a fluorine-containing resin, provided the material can be dissolved or dispersed within a solvent or water, and is able to be applied to form a coating.

There are no particular limitations on the fluorine-containing resin that is included within the coating material, provided the resin contains fluorine and does not impair the effects of the present invention, but a fluorine-containing resin that dissolves in the coating material solvent (an organic solvent or water) and is capable of cross-linking is preferred.

A fluoroolefin resin having a curable functional group is preferably used as the fluorine-containing resin that is included within the coating material. Examples of the curable functional group includes a hydroxyl group, carboxyl group, amino group and glycidyl group.

Specific examples of the aforementioned fluoroolefin resin having a curable functional group include polymers containing chlorotrifluoroethylene (CTFE) as the main component, such as Lumiflon (a product name, manufactured by Asahi Glass Co., Ltd.), Cefral Coat (a product name, manufactured by Central Glass Co., Ltd.) and Fluonate (a product name, manufactured by DIC Corporation), and polymers containing tetrafluoroethylene (TFE) as the main component, such as Zeffle (a product name, manufactured by Daikin Industries, Ltd.).

The above-mentioned Lumiflon is a series of amorphous resins containing CTFE, a number of specific alkyl vinyl ethers (VE), and a hydroxyalkyl vinyl ether as the main structural units. Polymers such as Lumiflon that include a hydroxyalkyl vinyl ether monomer unit are particularly desirable as they exhibit superior levels of solvent solubility, cross-linking reactivity, substrate adhesion, pigment dispersibility, hardness and flexibility.

The above-mentioned Zeffle is a series of copolymers of TFE and a hydrocarbon olefin that is soluble in organic solvents. Of these copolymers, those that employ a hydrocarbon olefin having a highly reactive hydroxyl group are particularly desirable as they exhibit superior levels of solvent solubility, cross-linking reactivity, substrate adhesion and pigment dispersibility.

Besides the fluorine-containing resin described above, the coating material may also include solvents, pigments, cross-linking agents and catalysts.

There are no particular limitations on the solvent included within the coating material, provided it does not impair the effects of the present invention, and examples of solvents that can be used favorably include solvents containing one or more organic solvents selected from the group consisting of methyl ethyl ketone (MEK), cyclohexanone, acetone, methyl isobutyl ketone (MIBK), toluene, xylene, methanol, isopropanol, ethanol, heptane, ethyl acetate, isopropyl acetate, n-butyl acetate and n-butyl alcohol.

Among these solvents, from the viewpoints of achieving good solubility of the components within the coating material and minimizing residual solvent within the coating film (by ensuring a low boiling point temperature), a solvent containing one or more organic solvents selected from the group consisting of xylene and MEK is particularly preferred.

There are no particular limitations on the pigment included in the coating material, provided it does not impair the effects of the present invention, and examples of pigments that can be used include titanium dioxide and silica. More specific examples of preferred materials include Ti-Pure R105 (a product name, manufactured by E.I. du Pont de Nemours and Company), which is a rutile titanium dioxide that has been treated with silicon oxide, and Cab-O-Sil TS-720 (a product name, manufactured by Cabot Corporation), which is a hydrophobic silica in which the hydroxyl groups at the silica surface have been modified via a dimethylsilicone surface treatment.

In order to improve the weather resistance and abrasion resistance of the coating film, the coating is preferably cured using a cross-linking agent.

There are no particular limitations on this cross-linking agent, provided it does not impair the effects of the present invention, and examples of cross-linking agents that can be used favorably include metal chelates, silanes, isocyanates, and melamines. If consideration is given to use of the back sheet 20 for 30 years or more in an outdoor environment, then from the viewpoint of weather resistance, an aliphatic isocyanate is preferred as the cross-linking agent.

Further, dioctyltin dilaurate can be used as the catalyst, and this catalyst is used for promoting the cross-linking between the fluorine-containing resin and the isocyanate.

There are no particular limitations on the composition of the coating material, provided it does not impair the effects of the present invention, and for example, the coating material may be prepared by mixing the fluorine-containing resin, a pigment, a cross-linking agent, a solvent and a catalyst.

In terms of the compositional ratio, based on a value of 100% by weight for the overall coating material, the amount of the fluorine-containing resin is preferably within a range from 3 to 80% by weight, and more preferably from 25 to 50% by weight, the amount of the pigment is preferably within a range from 5 to 60% by weight, and more preferably from 10 to 30% by weight, and the amount of the solvent is preferably within a range from 20 to 80% by weight, and more preferably from 25 to 65% by weight.

Conventional methods may be used as the method of applying the coating material to the substrate film 11, and for example, the coating material may be applied using a rod coater so as to achieve a desired thickness.

Although the temperature used for drying the coating material applied to the substrate film 11 may be any temperature that does not impair the effects of the present invention, from the viewpoint of reducing any effects on the substrate film 11, the drying temperature is preferably within a range from 50 to 130° C.

In the solar cell module protective sheet 20, an additional fluororesin layer 14 is provided on the structure of the solar cell module protective sheet 10 according to the first embodiment, and therefore in addition to the effects obtained for the solar cell module protective sheet 10 of the present invention, the weather resistance and chemical resistance of the solar cell module can also be improved.

(3) Third Embodiment

Figure 3:
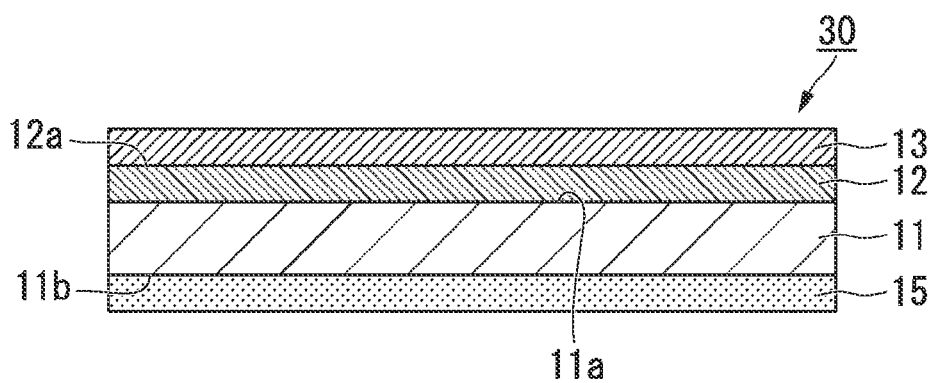
FIG. 3 is a cross-sectional view illustrating yet another embodiment of the protective sheet for a solar cell module according to the present invention.

FIG. 3 is a cross-sectional view illustrating a third embodiment of the protective sheet for a solar cell module according to the present invention.

In FIG. 3, structural elements that are the same as those of the solar cell module protective sheet 10 illustrated in FIG. 1 are labeled using the same symbols, and description of those elements is omitted.

In a similar manner to the first embodiment, the solar cell module protective sheet 30 of this embodiment may be used as either the front sheet or the back sheet of a solar cell module.

In the solar cell module protective sheet 30, in addition to the structure of the solar cell module protective sheet 10 of the first embodiment, a vapor deposition layer 15 is provided.

In this embodiment, the substrate film 11, the polyolefin resin layer 12 and the cycloolefin resin layer 13 have the same structures as those described for the first embodiment.

The vapor deposition layer 15 is laminated to the surface (hereafter also referred to as "the other surface") 11b of the substrate film 11 opposite the surface on which the polyolefin resin layer 12 and the cycloolefin resin layer 13 are provided.

The vapor deposition layer 15 is composed of a metal or semimetal, or an inorganic material such as an oxide, nitride, oxynitride or silicide of a metal or semimetal, and may be any inorganic material that can be formed on the substrate film 11 by vapor deposition.

Examples of the vapor deposition method used for forming the vapor deposition layer 15 include chemical vapor deposition methods such as plasma chemical vapor deposition methods, thermal chemical vapor deposition methods and optical chemical vapor deposition methods, and physical vapor phase methods such as vacuum deposition methods, sputtering methods and ion plating methods. Among these methods, if due consideration is given to operability and controllability of the thickness of the layer, then a vacuum deposition method is preferred.

The vapor deposition layer 15 functions as a water vapor barrier layer having water vapor barrier properties. Further, by applying the vapor deposition layer 15 to a solar cell module, the weather resistance of the solar cell module can be enhanced.

Examples of metals that may be used include aluminum (Al), magnesium (Mg), calcium (Ca), potassium (K), tin (Sn), sodium (Na), titanium (Ti), lead (Pb), zirconium (Zr) and yttrium (Y).

Examples of semimetals that may be used include silicon (Si) and boron (B).

Examples of oxides, nitrides and oxynitrides of these metals and semimetals include aluminum oxide, tin oxide, silicon oxide, silicon nitride, silicon oxynitride and aluminum oxynitride.

The vapor deposition layer 15 may be a vapor deposition layer composed of a single inorganic material, or a vapor deposition layer composed of a plurality of inorganic materials.

In those cases where the vapor deposition layer 15 is composed of a plurality of inorganic materials, the vapor deposition layer may have a laminated structure in which layers of each of the inorganic materials are deposited sequentially, or the vapor deposition layer may be formed by depositing the plurality of inorganic materials simultaneously.

The thickness of the vapor deposition layer 15 may be set appropriately with due consideration of the water vapor barrier properties, and varies depending on the inorganic material that is used and the vapor deposition density. The thickness of the vapor deposition layer 15 is preferably within a range from 5 nm to 200 nm, and is more preferably from 10 nm to 100 nm.

In the solar cell module protective sheet 30, in addition to the structure of the solar cell module protective sheet 10 according to the first embodiment, the vapor deposition layer 15 is provided on the substrate film 11, and therefore in addition to the effects obtained for the solar cell module protective sheet 10, the water vapor barrier properties and the weather resistance can also be improved.

This embodiment illustrated an example of a solar cell module protective sheet 30 in which the vapor deposition layer 15 was provided on the other surface 11b of the substrate film 11, but the protective sheet for a solar cell module according to the present invention is not limited to this particular configuration. In the protective sheet for a solar cell module according to the present invention, vapor deposition layers may be provided on both surfaces (the front surface and the other surface) of the substrate film.

(4) Fourth Embodiment

Figure 4:
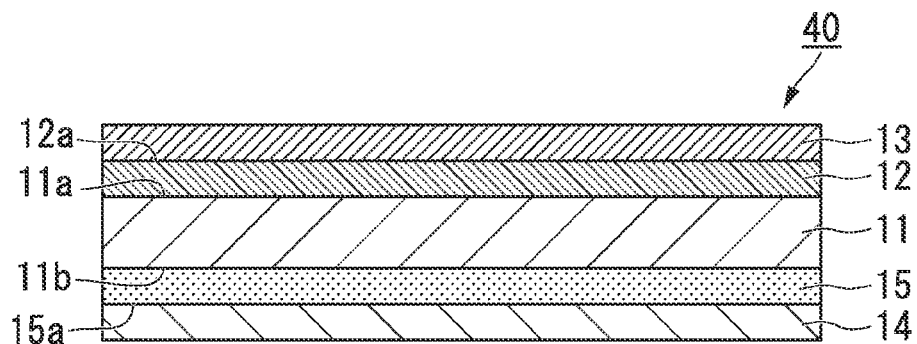
FIG. 4 is a cross-sectional view illustrating yet another embodiment of the protective sheet for a solar cell module according to the present invention.

FIG. 4 is a cross-sectional view illustrating a fourth embodiment of the protective sheet for a solar cell module according to the present invention.

In FIG. 4, structural elements that are the same as those of the solar cell module protective sheet 10 illustrated in FIG. 1, the solar cell module protective sheet 20 illustrated in FIG. 2, or the solar cell module protective sheet 30 illustrated in FIG. 3, are labeled using the same symbols, and description of those elements is omitted.

In a similar manner to the first embodiment, the second embodiment and the third embodiment, the solar cell module protective sheet 40 of this embodiment may be used as either the front sheet or the back sheet of a solar cell module.

In the solar cell module protective sheet 40, in addition to the structure of the solar cell module protective sheet 30 of the third embodiment, a fluororesin layer 14 is also provided.

In this embodiment, the substrate film 11, the polyolefin resin layer 12 and the cycloolefin resin layer 13 have the same structures as those described for the first embodiment, the fluororesin layer 14 has the same structure as that described for the second embodiment, and the vapor deposition layer 15 has the same structure as that described for the third embodiment.

The fluororesin layer 14 is laminated to the surface (hereafter also referred to as "one surface") 15a of the vapor deposition layer 15 opposite the surface that contacts the substrate film 11. The fluororesin layer 14 is provided so as to form a cured layer. Examples of the method used for laminating the fluororesin layer 14 to the one surface 15a of the vapor deposition layer 15 include the same methods as those described above in the second embodiment for laminating the fluororesin layer 14 to the substrate film 11.

In the solar cell module protective sheet 40, in addition to the structure of the solar cell module protective sheet 30 according to the third embodiment, the fluororesin layer 14 is provided, and therefore in addition to the effects obtained for the solar cell module protective sheet 30, the weather resistance and chemical resistance of the solar cell module can also be improved. Accordingly, in order to improve the weather resistance and chemical resistance of the solar cell module protective sheet 40, the fluororesin layer 14 is preferably provided on the outer surface of the vapor deposition layer 15 (the one surface 15a of the vapor deposition layer 15) in the solar cell module protective sheet 40.

(5) Fifth Embodiment

Figure 5:
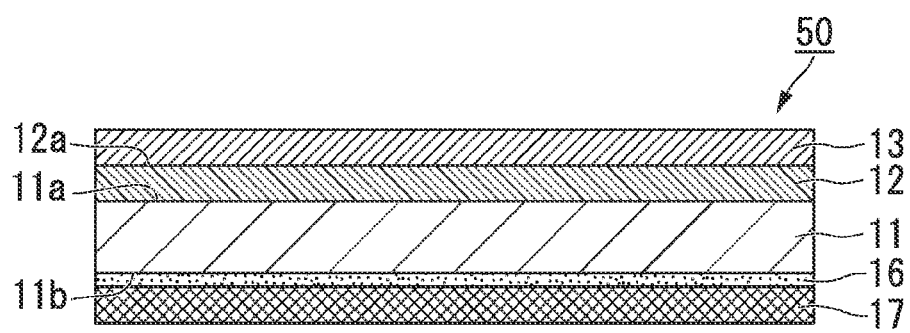
FIG. 5 is a cross-sectional view illustrating yet another embodiment of the protective sheet for a solar cell module according to the present invention.

FIG. 5 is a cross-sectional view illustrating a fifth embodiment of the protective sheet for a solar cell module according to the present invention.

In FIG. 5, structural elements that are the same as those of the solar cell module protective sheet 10 illustrated in FIG. 1 are labeled using the same symbols, and description of those elements is omitted.

The solar cell module protective sheet 50 of this embodiment is used as the back sheet of a solar cell module.

In the solar cell module protective sheet 50, in addition to the structure of the solar cell module protective sheet 10 of the first embodiment, a metal sheet 17 is also provided.

In this embodiment, the substrate film 11, the polyolefin resin layer 12 and the cycloolefin resin layer 13 have the same structures as those described for the first embodiment.

The metal sheet 17 is laminated, via an adhesive layer 16, to the surface (hereafter also referred to as "the other surface") 11b of the substrate film 11 opposite the surface 11a on which the polyolefin resin layer 12 and the cycloolefin resin layer 13 are provided.

The adhesive layer 16 is formed from an adhesive that exhibits good adhesion to the substrate film 11.

Examples of adhesives that can be used for forming the adhesive layer 16 include polyacrylic-based adhesives, polyurethane-based adhesives, epoxy-based adhesives, polyester-based adhesives, and polyester polyurethane-based adhesives. These adhesives may be used individually, or two or more adhesives may be used in combination.

Examples of the metal sheet 17 include sheets formed from a metal such as aluminum, an aluminum-iron alloy, or copper.

There are no particular limitations on the thickness of the metal sheet 17, provided it does not impair the effects of the present invention, but from the viewpoints of reducing the frequency of pinholes, strengthening the mechanical strength, improving the water vapor barrier properties, and lightening the weight, the thickness is preferably within a range from 5 μm to 100 μm, and more preferably from 10 μm to 30 μm.

In the solar cell module protective sheet 50, in addition to the structure of the solar cell module protective sheet 10 according to the first embodiment, the metal sheet 17 is provided on the substrate film 11 with the adhesive layer 16 disposed therebetween, and therefore in addition to the effects obtained for the solar cell module protective sheet 10, the water vapor barrier properties can be improved.

(6) Sixth Embodiment

Figure 6:
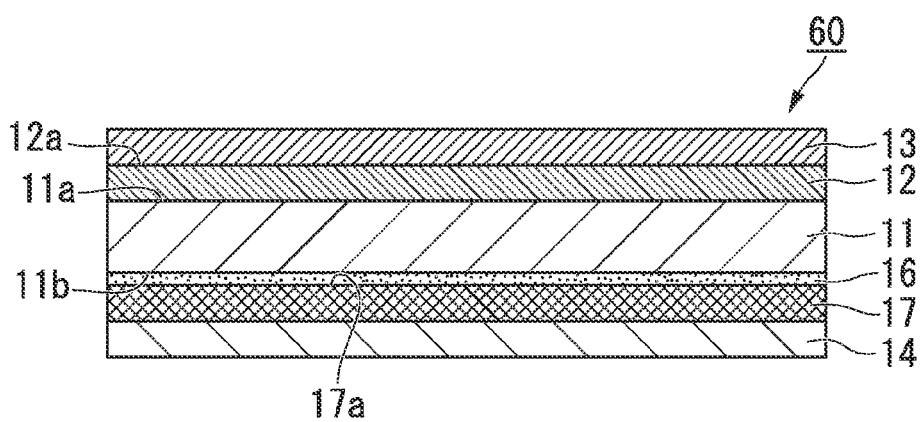
FIG. 6 is a cross-sectional view illustrating yet another embodiment of the protective sheet for a solar cell module according to the present invention.

FIG. 6 is a cross-sectional view illustrating a sixth embodiment of the protective sheet for a solar cell module according to the present invention.

In FIG. 6, structural elements that are the same as those of the solar cell module protective sheet 10 illustrated in FIG. 1 or the solar cell module protective sheet 50 illustrated in FIG. 5 are labeled using the same symbols, and description of those elements is omitted.

The solar cell module protective sheet 60 of this embodiment is used as the back sheet of a solar cell module.

In the solar cell module protective sheet 60, in addition to the structure of the solar cell module protective sheet 50 of the fifth embodiment, a fluororesin layer 14 is also provided.

In this embodiment, the substrate film 11, the polyolefin resin layer 12 and the cycloolefin resin layer 13 have the same structures as those described for the first embodiment, and the adhesive layer 16 and the metal sheet 17 have the same structures as those described for the fifth embodiment.

The fluororesin layer 14 is laminated to the surface of the metal sheet 17 opposite the surface 17a that contacts the adhesive layer 16.

The fluororesin layer 14 has the same structure as the fluororesin layer 14 described above.

The thickness of the fluororesin layer 14 is set with due consideration of the weather resistance, the chemical resistance, and minimizing the weight, and is preferably within a range from 5 μm to 50 μm, and more preferably from 10 μm to 30 μm.

In the solar cell module protective sheet 60, in addition to the structure of the solar cell module protective sheet 50 according to the fifth embodiment, the fluororesin layer 14 is provided, and therefore in addition to the effects obtained for the solar cell module protective sheet 50, the weather resistance and chemical resistance of the solar cell module can also be improved. Accordingly, in order to improve the weather resistance and chemical resistance of the solar cell module protective sheet 60, the fluororesin layer 14 is preferably provided on the outer surface of the metal sheet 17 in the solar cell module protective sheet 60.

(7) Seventh Embodiment

Figure 7:
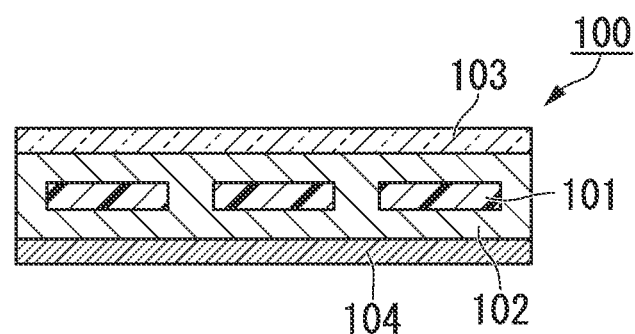
FIG. 7 is a cross-sectional view illustrating an embodiment of a solar cell module of the present invention.

FIG. 7 is a cross-sectional view illustrating an embodiment of a solar cell module of the present invention.

The solar cell module 100 includes solar cell 101 formed from crystalline silicon or amorphous silicon or the like, a encapsulant (filler layer) 102 formed from an electrical insulator that encapsulates the solar cell 101, a front surface protective sheet (front sheet) 103 laminated to the front surface of the encapsulant 102, and a back surface protective sheet (back sheet) 104 laminated to the back surface of the encapsulant 102.

In this embodiment, the solar cell module 100 includes the solar cell module protective sheet according to any one of the first to sixth embodiments described above as the front sheet 103 or the back sheet 104.

In this embodiment, the resin that constitutes the encapsulant 102 is preferably a polyolefin resin.

Examples of the polyolefin resin include polyethylenes such as low-density polyethylene (LDPE, density: not less than 0.910 g/cm$^3$ but less than 0.930 g/cm$^3$), medium-density polyethylene (MDPE, density: not less than 0.930 g/cm$^3$ but less than 0.942 g/cm$^3$) and high-density polyethylene (HDPE, density: not less than 0.942 g/cm$^3$), polypropylene (PP), olefin-based elastomers (TPO), cycloolefin resins, ethylene-vinyl acetate copolymers (EVA), ethylene-vinyl acetate-maleic anhydride copolymers, ethylene-(meth)acrylate copolymers, and ethylene-(meth)acrylate-maleic anhydride copolymers.

By using this type of polyolefin resin, the affinity between the encapsulant 102 and the cycloolefin resin layer 13 of the solar cell module protective sheet according to any one of the first to sixth embodiments can be increased, yielding a greater bonding strength between the cycloolefin resin layer 13 and the encapsulant 102.

By using the solar cell module protective sheet according to any one of the first to sixth embodiments as the front sheet or back sheet of the solar cell module, a solar cell module that exhibits the effects described above can be obtained. More specifically, because the protective sheet for a solar cell module according to the present invention exhibits excellent adhesion to the encapsulant and excellent water vapor barrier properties, by using this solar cell module protective sheet within a solar cell module, a solar cell module having superior durability and moisture resistance can be provided.

Moreover, by using a flexible substrate for the solar cell that constitute the solar cell module, and using the solar cell module protective sheet according to any one of the first to sixth embodiments as the front sheet or back sheet of the solar cell module, a solar cell module having good flexibility can be obtained. In this manner, by making the solar cell module flexible, mass production via a roll-to-roll process becomes possible. Further, because solar cell modules that have flexibility can be fitted to items having arch-shaped or parabolic wall surfaces, the modules can also be installed on dome-shaped buildings and motorway noise barriers and the like.

EXAMPLES

The present invention is described below in further detail using a series of examples, although the present invention is in no way limited by the examples presented below.

Example 1

For the substrate film, one surface of a PET film (product name: Lumirror X10S, a low oligomer content PET, thickness: 125 μm, manufactured by Toray Industries, Inc.) was subjected to a corona treatment at an output of 2,000 W.

Using a co-extruder (cylinder temperature: 200° C., T-die temperature: 320° C.), a low-density polyethylene (product name: Petrosen 205, MFR: 8 g/10 min., manufactured by Tosoh Corporation) and a cycloolefin resin (product name: Zeonor 1600, MFR: 6 g/10 min., manufactured by Zeon Corporation) were co-extruded onto the corona-treated surface of the PET film in amounts sufficient to form layers each having a thickness of 25 μm, thus preparing a protective sheet for a solar cell module in which the cycloolefin resin was laminated to the PET film with the low-density polyethylene disposed therebetween.

Example 2

With the exception of replacing the low-density polyethylene with an ethylene-glycidyl methacrylate copolymer (product name: Lotader AX8840, ethylene: 92% by weight, glycidyl methacrylate: 8% by weight, MFR: 5 g/10 min., manufactured by Arkema Inc.), a protective sheet for a solar cell module was prepared in the same manner as the example 1.

Example 3

With the exception of replacing the low-density polyethylene with an ethylene-ethyl acrylate-maleic anhydride copolymer (product name: Bondine LX4110, ethylene: 92% by weight, ethyl acrylate: 5% by weight, maleic anhydride: 3% by weight, MFR: 5 g/10 min., manufactured by Arkema Inc.), a protective sheet for a solar cell module was prepared in the same manner as the example 1.

Example 4

For the substrate film, one surface of a PET film (product name: Lumirror X10S, thickness: 125 μm, manufactured by Toray Industries, Inc.,) was subjected to a corona treatment at an output of 2,000 W.

Using a co-extruder (cylinder temperature: 200° C., T-die temperature: 320° C.), an EVA (product name: Evertate D3022, ethylene: 94% by weight, vinyl acetate: 6% by weight, MFR: 7 g/10 min., manufactured by Sumitomo Chemical Co., Ltd.) and a cycloolefin resin (product name: Zeonor 1600, MFR: 6 g/10 min., manufactured by Zeon Corporation) were co-extruded onto the corona-treated surface of the PET film in amounts sufficient to form layers each having a thickness of 25 μm, thus preparing a protective sheet for a solar cell module in which the cycloolefin resin was laminated to the PET film with the EVA disposed therebetween.

Moreover, by using a rod coater to apply a fluororesin solution to the surface of the PET film opposite the surface onto which the EVA and the cycloolefin resin had been laminated, and subsequently drying the solution at 120° C. for one minute, a fluororesin layer having a thickness of 15 μm was formed, thus completing preparation of a protective sheet for a solar cell module.

The fluororesin solution was prepared by mixing 100 parts by weight of a fluorine-containing resin (product name: Lumiflon LF-200, solid fraction: 60%, manufactured by Asahi Glass Co., Ltd.), 10 parts by weight of a cross-linking agent (product name: Desmodur N3300, an aliphatic isocyanate, manufactured by Bayer MaterialScience AG) and 30 parts by weight of a pigment (product name: Ti-Pure R-105, a titanium dioxide, manufactured by E.I. du Pont de Nemours and Company), and then diluting the mixture with MEK.

Example 5

With the exceptions of using a PET film (product name: Tetoron SL, shrinkage rate following heating at 150° C. for 30 minutes: 0.4%, thickness: 125 μm, manufactured by Teijin DuPont Films Ltd.) as the substrate film, and replacing the EVA with an ethylene-glycidyl methacrylate copolymer, a protective sheet for a solar cell module was prepared in the same manner as the example 4.

Example 6

With the exception of replacing the low-density polyethylene with an ethylene-butyl acrylate copolymer (product name: Lotryl 30BA02, ethylene: 70% by weight, butyl acrylate: 30% by weight, MFR: 2 g/10 min., manufactured by Arkema Inc.), a protective sheet for a solar cell module was prepared in the same manner as the example 1.

Example 7

With the exception of replacing the low-density polyethylene with an ethylene-methyl acrylate copolymer (product name: Lotryl 28MA07, ethylene: 72% by weight, methyl acrylate: 28% by weight, MFR: 7 g/10 min., manufactured by Arkema Inc.), a protective sheet for a solar cell module was prepared in the same manner as the example 1.

Comparative Example 1

With the exception of extruding only a single layer of the cycloolefin resin (product name: Zeonor 1600, MFR: 6 g/10 min., manufactured by Zeon Corporation) directly onto the corona-treated surface of the PET film, so as to form a cycloolefin resin layer having a thickness of 50 μm, a protective sheet for a solar cell module was prepared in the same manner as the example 1.

Comparative Example 2

With the exceptions of performing melt-kneading of 50% by weight of the cycloolefin resin (product name: Zeonor 1600, MFR: 6 g/10 min., manufactured by Zeon Corporation) and 50% by weight of the low-density polyethylene (product name: Petrosen 205, MFR: 8 g/10 min., manufactured by Tosoh Corporation), and then extruding a single layer of the mixture, so as to form a layer composed of a mixture of the cycloolefin resin and the low-density polyethylene and having a thickness of 50 μm on the PET film, a protective sheet for a solar cell module was prepared in the same manner as the example 1.

The solar cell module protective sheets obtained in the examples 1 to 7 and the comparative examples 1 and 2 were evaluated for adhesion to the substrate, adhesion to the encapsulant, and water vapor barrier properties. The results are shown in Table 1. Each of the test methods are described below.

[Adhesion Test 1: Peel Adhesive Strength at the Interface Between the Polyolefin Resin Layer and the Substrate Film]

The protective sheets of the examples 1 to 7 and the comparative examples 1 and 2 were each cut into a strip having dimensions of 25 mm×150 mm, and the peel adhesive strength was measured in accordance with ISO 11339:1993, in an environment at 23° C. and 50% RH (relative humidity), and at a peel speed of 300 mm/minute.

For the examples 1 to 7, the peel adhesive strength was measured at the interface between the polyolefin resin layer and the PET film, for the comparative example 1, the peel adhesive strength was measured at the interface between the cycloolefin resin and the PET film, and for the comparative example 2, the peel adhesive strength was measured at the interface between the cycloolefin resin/low-density polyethylene mixed layer and the PET film.

[Adhesion Test 2: Peel Adhesive Strength at the Interface Between the Protective Sheet and the Encapsulant]

For each of the protective sheets of the examples 1 to 7 and the comparative examples 1 and 2, the cycloolefin resin layer of the protective sheet was stacked on an EVA encapsulant (product name: Ultra Pearl, thickness: 400 μm, manufactured by Sanvic Inc.), and the resulting structure was fed into a vacuum laminator and crimped at 150° C. and 1 atm. for 15 minutes.

The sample was cut into a strip of 15 mm×200 mm, and the peel adhesive strength was measured in accordance with ISO 11339:1993, in an environment at 23° C. and 50% RH, and at a peel speed of 300 mm/minute.

For the examples 1 to 7 and the comparative example 1, the peel adhesive strength was measured at the interface between the cycloolefin resin and the encapsulant, and for the comparative example 2, the peel adhesive strength was measured at the interface between the cycloolefin resin/low-density polyethylene mixture and the encapsulant.

[Water Vapor Barrier Properties]

The protective sheets of the examples 1 to 7 and the comparative examples 1 and 2 were each cut to a sample size of 90 mm×90 mm, and using a water vapor transmission rate measurement apparatus (product name: Permatran-W3/33, manufactured by Mocon, Inc.), the water vapor transmission rate was measured in accordance with ASTM F 1249, under conditions of 40° C. and 90% RH.

TABLE 1

|  | Adhesion Test 1 [N/25 mm] | Adhesion Test 2 [N/25 mm] | Water vapor barrier properties [g/m$^2$/24 h] |
| --- | --- | --- | --- |
| Example 1 | 10.6 | 52.1 | 0.63 |
| Example 2 | 17.3 | 62.2 | 0.69 |

TABLE 1-continued

|  | Adhesion Test 1 [N/25 mm] | Adhesion Test 2 [N/25 mm] | Water vapor barrier properties [g/m$^2$/24 h] |
|---|---|---|---|
| Example 3 | 18.1 | 61.9 | 0.77 |
| Example 4 | 12.4 | 55.5 | 0.71 |
| Example 5 | 16.9 | 57.2 | 0.85 |
| Example 6 | 17.8 | 63.5 | 0.68 |
| Example 7 | 13.5 | 59.2 | 0.66 |
| Comparative example 1 | 0.4 | 0.4 *1) | 0.67 |
| Comparative example 2 | 3.2 | 0.8 *1) | 2.44 |

*1) Peeling occurred at the interface between the PET film and the cycloolefin resin The results in Table 1 confirmed that, compared with the comparative examples 1 and 2, the examples 1 to 7 that employed the protective sheet for a solar cell module according to the present invention exhibited favorable water vapor barrier properties and provided superior adhesion to the substrate and superior adhesion to the encapsulant. On the basis of these results, it is evident that the protective sheet for a solar cell module according to the present invention has excellent water vapor barrier properties and excellent adhesion to encapsulants.

INDUSTRIAL APPLICABILITY

The protective sheet for a solar cell module according to the present invention, when applied to a solar cell module, is able to provide a solar cell module having excellent durability and moisture resistance, and is therefore extremely useful industrially.

DESCRIPTION OF THE REFERENCE SIGNS

10, 20, 30, 40, 50, 60: Protective sheet for a solar cell module
11: Substrate film
12: Polyolefin resin layer
13: Cycloolefin resin layer
14: Fluororesin layer
15: Vapor deposition layer
16: Adhesive layer
17: Metal sheet
100: Solar cell module
101: Solar cell unit cell
102: Encapsulant
103: Front surface protective sheet (front sheet)
104: Back surface protective sheet (back sheet)

The invention claimed is:

1. A protective sheet for a solar cell module, the protective sheet comprising
   a cycloolefin resin layer laminated to one surface of a polyethylene terephthalate film with a polyolefin resin layer disposed therebetween, and
   a fluororesin layer laminated to a surface of the polyethylene terephthalate film which is opposite the surface on which the polyolefin resin layer and the cycloolefin resinlayer are laminated, wherein
   the polyolefin resin layer and the cycloolefin resin layer are formed by co-extrusion molding; and
   a peel adhesive strength at the interface between the polyolefin resin layer and the substrate film is 10.6 to 18.1 N/25 mm.

2. The protective sheet for a solar cell module according to claim 1, wherein the polyolefin resin layer comprises one resin selected from the group consisting of
   polyethylene, maleic anhydride-grafted polyethylene, ethylene-(meth)acrylate copolymers, ethylene-(meth)acrylate-glycidyl methacrylate copolymers, and ethylene-vinyl acetate copolymers.

3. A solar cell module produced using the protective sheet for a solar cell module according to claim 1 or 2.

\* \* \* \* \*